United States Patent [19]

Tsuchiya et al.

[11] Patent Number: 4,729,010
[45] Date of Patent: Mar. 1, 1988

[54] INTEGRATED CIRCUIT PACKAGE WITH LOW-THERMAL EXPANSION LEAD PIECES

[75] Inventors: Masatoshi Tsuchiya; Satoru Ogihara; Hiromi Kagohara, all of Hitachi; Kanji Otsuka, Higashi-Yamato; Tomoji Oishi, Hitachi, all of Japan

[73] Assignee: Hitachi, Ltd., Tokyo, Japan

[21] Appl. No.: 890,533

[22] Filed: Jul. 30, 1986

[30] Foreign Application Priority Data

Aug. 5, 1985 [JP] Japan .................. 60-171068
Aug. 21, 1985 [JP] Japan .................. 60-181692

[51] Int. Cl.$^4$ .............................. H01L 23/14
[52] U.S. Cl. ................................. 357/70; 357/80; 428/901
[58] Field of Search ............ 428/901; 501/15, 17, 501/32; 357/80, 69, 70, 71

[56] References Cited

U.S. PATENT DOCUMENTS

| | | | |
|---|---|---|---|
| 3,340,347 | 9/1967 | Spiegler | 357/70 |
| 4,135,038 | 1/1979 | Takami et al. | 174/52 FP X |
| 4,299,873 | 11/1981 | Ogihara et al. | 428/901 X |
| 4,370,421 | 1/1983 | Matsushita et al. | 357/80 |
| 4,515,898 | 5/1985 | Davis et al. | 501/15 |
| 4,517,584 | 5/1985 | Matsushita et al. | 357/80 |
| 4,522,925 | 6/1985 | Pirooz et al. | 501/15 |
| 4,554,573 | 11/1985 | Yamamoto et al. | 357/71 |
| 4,571,610 | 2/1986 | Matsushita et al. | 357/80 |
| 4,581,279 | 4/1986 | Sugishita et al. | 428/901 X |
| 4,591,537 | 5/1986 | Aldinger et al. | 428/901 X |
| 4,624,896 | 11/1986 | Watanabe et al. | 428/428 |
| 4,651,192 | 3/1987 | Matsushita et al. | 357/80 |

*Primary Examiner*—A. D. Pellinen
*Assistant Examiner*—H. L. Williams
*Attorney, Agent, or Firm*—Antonelli, Terry & Wands

[57] ABSTRACT

An integrated circuit package in which semiconductor elements mounted on an insulating substrate, ends of lead pieces introduced from the outside and wires that electrically connect them, are accommodated in a cell that is air-tightly defined by the substrate, a cap and a sealing glass. The lead pieces are composed of an alloy having a coefficient of thermal expansion nearly equal to, or smaller than, the coefficient of thermal expansion of the substrate. The alloy is an iron alloy which contains nickel and cobalt, and having a martensite transformation temperture of lower than $-55°$ C.

18 Claims, 5 Drawing Figures

INTEGRATED CIRCUIT PACKAGE WITH LOW-THERMAL EXPANSION LEAD PIECES

FIELD OF THE INVENTION

The present invention relates to an integrated circuit package of the structure in which semiconductor elements are formed on an insulating substrate composed of a silicon carbide ceramic and the circumference thereof is air-tightly covered with a cap. More specifically, the invention relates to an integrated circuit package of the structure in which the substrate and the cap are sealed with a glass.

The integrated circuit package of the present invention is adapted to be used in electronic computers.

BACKGROUND OF THE INVENTION

A known integrated circuit package consists of accommodating semiconductor elements, ends of lead pieces introduced from the external side, and wires that electrically connect the semiconductor elements and the lead pieces together in a small cell that is air-tightly defined by an insulating substrate of a ceramics, a cap and a sealing glass. For instance, Japanese Patent Laid-Open No. 134852, 1984 entitled "Integrated Circuit Package" laid open on Aug. 2, 1984 exemplifies the use of a silicon carbide ceramic as an insulating substrate instead of the traditionally used alumina sintered product.

In such an integrated circuit package, however, cracks easily develop in a glass layer that seals the substrate and the cap, as disclosed in the above publication (page 2, right lower column, line 17 to page 3, left upper column, line 2).

To prevent the glass layer from being cracked, the above publication teaches the cap that is composed of a ceramic material having a coefficient of thermal expansion close to that of an insulating substrate composed of a silicon carbide ceramic.

SUMMARY OF THE INVENTION

The object of the present invention is to provide an integrated circuit package which is capable of preventing the glass layer from being cracked thereby maintaining increased reliability.

Along with the study to utilize the silicon carbide substrate, the inventors have prepared an integrated circuit package in which semiconductor elements were mounted on the silicon carbide substrate, ends of electric leads were connected to the semiconductor elements, portions where the leads were connected to the semiconductor elements were packaged with a sealing glass, and the electric leads were taken out to the external side through the glass accompanied, however, by a problem that the sealing glass was cracked and, particularly, the glass around the lead terminals was cracked. Should that happen, a cell containing the semiconductor element is communicated with the open air, and moisture contained in the open air enters into the cell so that the device may malfunction.

It is considered that the sealing glass is cracked by the thermal stress produced by the lead material that has a large coefficient of thermal expansion.

In order to prevent the sealing glass from being cracked, it can generally be considered to use a lead material having a coefficient of thermal expansion that is in agreement with the coefficient of thermal expansion of the sealing glass. Through the study, however, the inventors of the present invention have confirmed that in the case of the package of the present invention that employs a silicon carbide ceramics as the substrate, the sealing glass was not at all prevented from being cracked even when the coefficient of thermal expansion of the lead material was brought into agreement with the coefficient of thermal expansion of the glass.

The inventors therefore have furthered the study and have found the fact that the sealing glass can be very effectively prevented from being cracked if the coefficient of thermal expansion of the lead material is set to be nearly equal to, or smaller than, the coefficient of thermal expansion of the substrate, instead of selecting the coefficient of thermal expansion of the lead material relying upon the coefficient of thermal expansion of the glass as a reference. The present invention was accomplished based upon this novel discovery.

Based upon the above discovery, the present invention restricts the coefficient of thermal expansion of the lead material in order to provide an integrated circuit package having increased stability and reliability, and its feature resides in an integrated circuit package which comprises semiconductor elements mounted on a silicon carbide substrate and leads introduced from the outside penetrating through a sealing glass, that are accommodated in a small cell air-tightly defined by said substrate, a cap and said sealing glass, wherein the coefficient of thermal expansion of a lead material is selected to be nearly equal to, or smaller than, the coefficient of thermal expansion of the substrate and, concretely speaking, is restricted to be smaller than $40 \times 10^{-7}/°C$.

The feature of the present invention further resides in an integrated circuit package having an insulating substrate composed of a silicon carbide ceramic, wherein the lead pieces are composed of an iron alloy which contains nickel and cobalt and which has a martensite transformation temperature of lower than $-55°$ C.

The inventors have found that one of the causes that crack the glass layer in the integrated circuit package that has an insulating substrate composed of a silicon carbide ceramic, is that the glass layer receives thermal stress during the cooling step after the sealing with glass is effected or during the life test in which the package that is completed is subjected to thermal cycles.

In order that the glass layer does not receive thermal stress, the inventors have reached the conclusion that the thermal expansion and contraction of the lead material should be brought to be nearly the same as the thermal expansion and contraction of the glass, and have thus accomplished the present invention.

The effects of the present invention are sufficiently proved by the life tests in which package is subjected to the thermal cycles. Namely, the present invention provides an integrated circuit package having improved reliability without cracks in the glass layer.

DETAILED DESCRIPTION OF THE PREFERRED EMBODIMENTS

The substrate employed in the present invention is a ceramic substrate composed substantially of silicon carbide. In particular, the substrate should be composed of a silicon carbide ceramic which contains at least one component selected from beryllium and a beryllium compound in an amount of 0.05 to 5% by weight in the base of beryllium. The substrate has a coefficient of thermal expansion of from 35 to $40 \times 10^{-7}/°C$. The material for forming the cap will be mullite ceramic, silicon carbide ceramic, zircon ceramic or silicon nitride ceramic, having a coefficient of thermal expansion within a range of from 35 to $50 \times 10^{-7}/°C$. The sealing glass is a low-melting glass having a coefficient of thermal expansion within a range of 45 to $55 \times 10^{-7}/°C$. and a sealing temperature of not higher than 470° C. Limitation is imposed on the sealing temperature because of the reasons described below. That is, with the semiconductor elements being joined onto the substrate, if the temperature of the sealing operation becomes higher than 470° C., aluminum or a like metal forming the electrode of a semiconductor diffuses into the pn junction of the semiconductor to deteriorate it. There is available no glass that can be adhered at low temperatures and that has a coefficient of thermal expansion close to that of the silicon carbide ceramic. Therefore, it has been attempted to decrease the coefficient of thermal expansion by blending a lead borosilicate-type glass having a low melting point with lead titanate that has a negative coefficient of thermal expansion, or by blending a glass with a filler such as β-eucryptite. However, if the filler is blended in large amounts, the glass loses the fluidity. Therefore, the coefficient of thermal expansion of the glass is limited to 45 to $55 \times 10^{-7}/°C$.

Figure 1:
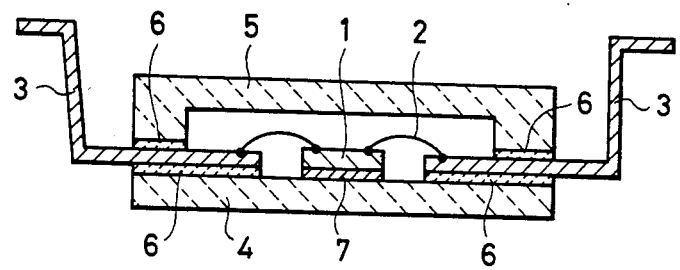
FIG. 1 is a section view of an integrated circuit package according to an embodiment of the present invention.

As described above, the sealing glass will be easily cracked and, particularly, the glass will be easily cracked around the lead terminals when the package is made of a glass through the heat-treatment using the silicon carbide ceramic shown in FIG. 1 as the substrate that is composed of the combination of the above-mentioned materials. According to the present invention as described above, however, a package having excellent reliability that does not develop cracks in the sealing glass can be obtained by selecting the coefficient of thermal expansion of the lead material to be smaller than $40 \times 10^{-7}/°C$. which is nearly equal to, or smaller than, the coefficient of thermal expansion of the substrate. The effect for preventing the development of cracks is attributed to that with the coefficient of thermal expansion of the lead material being limited as described above, the lead material sealed in the glass works to bring the coefficient of thermal expansion of the sealing glass close to the coefficient of thermal expansion of the substrate, though the sealing glass has the coefficient of thermal expansion that is greater than that of the substrate.

An example of such a lead material may be KOVAR, trademark, (Ni-Co-Fe alloy). In particular, the KOVAR should have a composition consisting of 28.5 to 30.0% by weight of nickel, 12.5 to 14% by weight of cobalt, less than 0.02% by weight of carbon, less than 0.2% by weight of silicon, less than 0.8% by weight of manganese, and the remainder being iron.

Next, the integrated circuit package of the present invention will be described in regard to its individual sections.

(A) Structure of the lead piece:

The lead piece according to the present invention is composed of a material having a phase transition temperature of lower than −55° C. and, concretely speaking, having a martensite transformation temperature of lower than −55° C. In the life test, the integrated circuit package is subjected to thermal cycles of usually between −55° C. and +150° C. Therefore, the lead piece must have a phase transition temperature of lower than −55° C. Examples of the material having such a very low phase transition temperature and a small coefficient of thermal expansion may be iron alloys which contain nickel and cobalt. Among the iron alloys, an alloy which contains 29 to 31% by weight of nickel and 12.5 to 15% by weight of cobalt, and has a coefficient of thermal expansion close to the coefficient of thermal expansion of the glass, is best suited for a material of the lead pieces. It was confirmed that the coefficient of thermal expansion of smaller than $40 \times 10^{-7}/°C$. can be obtained if a melt of Fe-Ni-Co alloy having the above-mentioned composition is subjected to the cold working of 10 to 60% followed by annealing at a temperature of 100 to 600° C. to remove stress. In practice, the alloy of the above-mentioned composition may further contain less than 0.1% by weight of carbon, less than 0.5% by weight of silicon, and less than 0.5% by weight of manganese. Other impurities such as phosphorus and sulfur that unavoidably infiltrate during the step of melting may of course be contained in amounts to a degree that are usually contained in melting the alloys.

If the contents of nickel and cobalt are smaller than the above-mentioned ranges, martensite is transformed when the alloy is cooled from the completely annealed state, and the coefficient of thermal expansion increases. If the contents of nickel and cobalt are greater than the above-mentioned ranges, on the other hand, austenite is chemically stabilized and the transformation point of martensite decreases. However, the coefficient of thermal expansion increases beyond $4 \times 10^{-7}/°C$. If the degree of cold working is smaller than 10%, the austenite is not stabilized. Depending upon the composition, furthermore, the coefficient of thermal expansion increases if the degree of cold working exceeds 60%. If the degree of cold working exceeds 90%, furthermore, there is formed a strain-induced martensite to greatly increase the coefficient of thermal expansion. Preferably, the cold working should be effected to a degree of 12 to 50%, so that the austenite is stabilized. To remove the stress, the annealing should be effected at a temperature lower than the recrystallization temperature of the material; i.e., the annealing should be effected preferably at 100° C. to 600° C. If the annealing is effected at a temperature lower than 100° C., the stress is not removed sufficiently and the lead may be deformed when it is sealed with the glass. If annealed at a temperature in excess of 600° C., the austenite loses stability, and the martensite is easily transformed.

Described below are the allowable amounts of elements that are added as deoxidizing and desulfurizing agents and elements that unavoidably infiltrate during the production. Carbon that works as a powerful deoxidizing agent is necessary to increase the degree of purity of the material. However, the coefficient of thermal expansion increases with the increase in the amount of carbon. Therefore, the amount of carbon should not be greater than 0.1% by weight. Silicon is also used as a deoxidizing agent. However, increase in the amount of silicon causes the toughness to decrease, resulting in the breakage of lead. Therefore, silicon should not be contained in an amount greater than 0.5% by weight. Manganese is used as a desulfurizing agent. However, if its content increases, the coefficient of thermal expansion increases. Therefore, the amount of manganese should not be greater than 0.5% by weight. Phosphorus and sulfur deteriorate the tenacity of the material. Therefore, the total amount of phosphorus and sulfur should not be greater than 0.01% by weight.

Table 1 shows coefficients of thermal expansion of an Ni-Fe alloy and Ni-Co-Fe alloys and their phase transformation temperatures as found from the change in the electric resistance.

TABLE 1

| Composition (% by weight) | Transformation temperature | Coefficient of thermal expansion ($\times 10^{-7}/°C.$) at 30° to 400° C. |
|---|---|---|
| 42 Ni—Fe | −196° C. or lower | 48.9 |
| 29 Ni—17 Co—Fe | −196° C. or lower | 44.5 |
| 29.5 Ni—14.5 Co—Fe | −150° ~ −196° C. | 32.6 |
| 30.5 Ni—13.2 Co—Fe | −100° ~ −150° C. | 37.4 |
| 29 Ni—12 Co—Fe | 0 ~ −30° C. | 41.2 |

Figure 2:
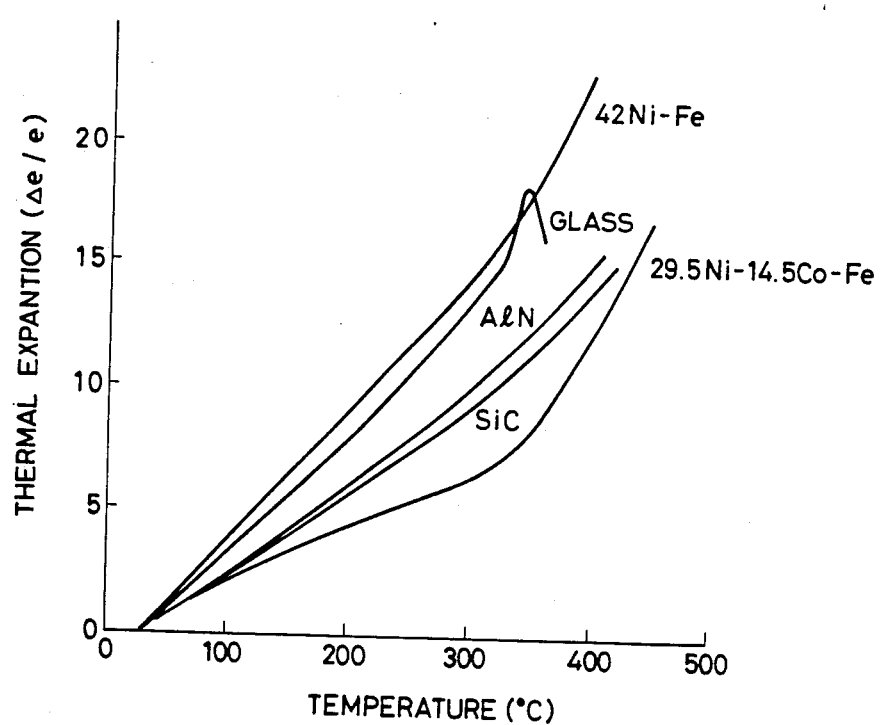
FIG. 2 is a diagram showing thermal expansion characteristics of the lead materials and the glass.

FIG. 2 shows thermal expansion characteristics of the Ni-Co-Fe alloy containing 29.5% by weight of nickel and 14.5% by weight of cobalt, that is a lead material of the present invention, the Ni-Fe alloy containing 42% by weight of nickel shown for the purpose of comparison, and the glass. The Ni-Co-Fe alloy is thermally expanded less than the glass.

(B) Structure of the insulating substrate:

The insulating substrate is composed of a silicon carbide ceramic. By using the silicon carbide ceramic instead of the conventional substrate composed of alumina sintered product, the heat generated by the semiconductor elements can be radiated efficiently.

The substrate of the silicon carbide ceramic can be produced by the sintering method that is usually carried out to produce molded products of ceramic.

A preferred insulating substrate is composed of a silicon carbide ceramic composed chiefly of silicon carbide containing at least one component selected from beryllium and a beryllium compound in an amount of 0.05 to 5% by weight on the basis of beryllium, which is a sintered product having a relative density of greater than 90% of the theoretical density. The coefficient of thermal expansion of such a sintered product ranges from 35 to $40 \times 10^{-7}/°C.$, which is close to the coefficient of thermal expansion of silicon. Further, the sintered product has a thermal conductivity of greater than 0.2 cal/cm.s.° C. The value 0.2 cal/cm.s.° C. represents the lower limit in the thermal conductivity that can be obtained maintaining good reproduceability when the silicon carbide ceramic is obtained by the sintering without adversely affecting the electrically insulating property (resistivity of greater than $10^7$ ohms-cm) and the coefficient of thermal expansion. Here, furthermore, the above value is about four times as great as the thermal conductivity of the existing substrate composed of alumina ceramic. Moreover, the coefficient of thermal expansion is close to that of silicon that is used for making semiconductor elements. When the semiconductor elements are joined to the substrate, therefore, small thermal stress is produced by the difference in the thermal expansion between the two.

In this sense, not only the sintered product of silicon carbide but also the sintered product of aluminum nitride can be used to obtain the substrates.

(C) Structure of the cap:

The cap for covering the semiconductor elements and wirings on the substrate should be composed of a material that has a coefficient of thermal expansion of 20 to $55 \times 10^{-7}/°C.$ Examples of such a material include silicon carbide ceramic, mullite ceramic, ziron ceramic, and silicon nitride ceramic. Using the cap material having the above-mentioned coefficient of thermal expansion, the difference of expansion relative to the insulating substrate composed of silicon carbide can be reduced to at least one-third or smaller compared with when the conventional alumina ceramic (having a coefficient of thermal expansion of about $65 \times 10^{-7}/°C.$) is used. Therefore, the thermal stress can be decreased correspondingly between the substrate and the cap.

(D) Structure of the sealing glass:

Ideally, the sealing glass should have a coefficient of thermal expansion close to that of the silicon carbide ceramic used for the substrate, i.e., should have a coefficient of thermal expansion of from 30 to $55 \times 10^{-7}/°C.$, and particularly from 40 to $55 \times 10^{-7}/°C.$ Sealing with the glass is effected after the semiconductor elements are adhered onto the insulating substrate. Therefore, the glass having a high melting point is not desirable. It is desirable to select a glass with which the sealing can be effected at a temperature of 500° C. or lower at the highest.

To satisfy these conditions, it is desired to use a glass of the $\beta$-eucryptite type, lead titanium type, or of the lead borate type containing both of them.

According to the present invention as described above, there is obtained an integrated circuit package that does not develop cracks in the sealing portion, that maintains high stability and reliability without permitting electric properties to be deteriorated, and that radiates the heat efficiently, even when it is cooled from the sealing temperature down to room temperature or even when it is subjected to the repetitive thermal cycles between −55° C. and +150° C.

EXAMPLE

With reference to FIG. 1, a semiconductor element 1 is adhered by a metal soldering layer 7 onto a central portion on one surface of an insulating substrate 4 composed of a silicon carbide ceramic. Onto the same surface are further adhered a plurality of lead pieces 3 by a sealing glass layer 6. Ends on one side of the lead pieces are electrically connected to the semiconductor element via bonding wires 2. Ends on the other side of the lead pieces 3 extend outwardly beyond the peripheral edge of the insulating substrate 4. The semiconductor element 1, bonding wires 2 and ends of the lead pieces 3 are surrounded by the insulating substrate and a cap 5. Caps among the cap 5, the insulating substrate 4 and the lead pieces 3 are air-tightly sealed with the sealing glass layer 6.

Packages of the above-mentioned structure are also prepared using different cap materials, glass materials and lead materials. The substrate is composed of a silicon carbide ceramic having a coefficient of thermal expansion of from 35 to $40 \times 10^{-7}/°C.$ It is particularly desired to use the silicon carbide ceramic which contains beryllium in an amount of 0.05 to 5% by weight, and which exhibits a resistivity of greater than $10^8$ ohms-cm, a thermal conductivity of 0.2 to 0.7 cal/cm.s.°C., a bending strength of greater than 30 kgf/mm², and a coefficient of thermal expansion of 35×10⁻⁷/°C.

This package is produced by a method described below. To join the semiconductor elements onto the silicon carbide substrate, first, a gold paste is printed and is baked. Then, the metal soldering layer 7 is formed on the substrate. The sealing glass 6 is printed onto the silicon carbide substrate and is baked to adhere the glass onto the substrate. The lead pieces 3 are placed on the upper surface of the sealing glass layer 6 that is heated at, for example, 450° to 480° C. which is higher than the softening temperature of the glass, in order to adhere the lead pieces thereto. The semiconductor element 1 is placed on the metal soldering layer 7 on the substrate, and the metal soldering layer 7 is heated at 350° to 450° C. so that the semiconductor element is adhered thereto. The semiconductor element is electrically connected to the lead pieces via wires 2. Next, the cap material 5 with the sealing glass 6 is placed thereon and is heated at 445° to 460° C. to seal it with the glass. The integrated circuit package is thus prepared. After being, the package is subjected to 20 thermal cycles of between −55° and 150° C. Then, the package is subjected to the helium leakage test to measure the amount of leakage and to evaluate whether the package is acceptable or not.

Table 2 shows combinations of the materials and the evaluated results of the packages.

TABLE 2

| No. | Lead material | | Glass material | | Cap material | | Evaluation |
|---|---|---|---|---|---|---|---|
| | Designation | Coefficient of thermal expansion (× 10⁻⁷/°C.) | Designation | Coefficient of thermal expansion (× 10⁻⁷/°C.) | Designation | Coefficient of thermal expansion (× 10⁻⁷/°C.) | |
| 1 | A | 43 | I | 51 | Mullite | 48 | NG |
| 2 | B | 41 | " | " | " | " | NG |
| 3 | C | 39 | " | " | " | " | OK |
| 4 | D | 35 | " | " | " | " | OK |
| 5 | E | 28 | " | " | " | " | OK |
| 6 | A | 43 | II | 48 | " | " | NG |
| 7 | C | 38 | " | " | " | " | OK |
| 8 | D | 35 | " | " | " | " | OK |
| 9 | E | 28 | " | " | " | " | OK |
| 10 | F | 30 | " | " | " | " | OK |
| 11 | A | 43 | III | 53 | " | " | NG |
| 12 | B | 41 | " | " | " | " | NG |
| 13 | C | 39 | III | 53 | Mullite | 48 | OK |
| 14 | D | 35 | " | " | " | " | OK |
| 15 | F | 30 | I | 51 | Zircon | 42 | OK |
| 16 | E | 28 | " | " | " | " | OK |
| 17 | F | 30 | " | " | Silicon nitride | 35 | OK |
| 18 | E | 28 | " | " | Silicon nitride | " | OK |
| 19 | F | 30 | " | " | Alumina | 65 | NG |

Leakage of helium took place in the packages Nos. 1, 2, 6, 11 and 12 that employed the lead materials having coefficients of thermal expansion of 41×10⁻⁷/°C. and 43×10⁻⁷/°C. Leakage of helium did not take place in the packages that employed lead materials having coefficients of thermal expansion of smaller than 39×10⁻⁷/°C. of the present invention. In the packages that have employed the cap composed of alumina, cracks developed in the glass even though the lead materials possessed small coefficients of thermal expansion.

Like Table 2, Table 3 evaluates the packages consisting of different materials relying upon the test of helium leakage.

TABLE 3

| No. | Lead material | | Glass material | | Cap material | | Evaluation |
|---|---|---|---|---|---|---|---|
| | Designation | Coefficient of thermal expansion (× 10⁻⁷/°C.) | Designation | Coefficient of thermal expansion (× 10⁻⁷/°C.) | Designation | Coefficient of thermal expansion (× 10⁻⁷/°C.) | |
| 20 | F | 30 | IV | 53 | Alumina | 65 | NG |
| 21 | A | 43 | " | " | Mullite | 48 | NG |
| 22 | B | 41 | " | " | " | " | NG |
| 23 | C | 38 | " | " | " | " | OK |
| 24 | D | 35 | " | " | " | " | OK |
| 25 | E | 28 | " | " | " | " | OK |
| 26 | A | 43 | V | 56 | " | " | NG |
| 27 | B | 41 | " | " | " | " | NG |
| 28 | C | 38 | " | " | " | " | NG |
| 29 | D | 35 | " | " | " | " | NG |
| 30 | E | 28 | " | " | " | " | NG |
| 31 | A | 43 | IV | 53 | Zircon | 42 | NG |
| 32 | B | 41 | IV | 53 | Zircon | 42 | NG |
| 33 | C | 38 | " | " | " | " | OK |
| 34 | D | 35 | " | " | " | " | OK |
| 35 | E | 28 | " | " | " | " | OK |
| 36 | E | 28 | " | " | Alumina | 65 | NG |

Packages employing the cap composed of alumina developed cracks in the sealing glass and were not acceptable (Nos. 20 and 36). Helium did not leak in the packages that employed the lead materials having coefficients of thermal expansion of smaller than $38 \times 10^{-7}/°C$., the glass material having a coefficient of thermal expansion of 5333 $10^{-7}/°C$. and the cap composed of mullite or zircon (Nos. 23, 24, 25, 33, 34 and 35). However, leakage of helium took place in the packages that employed the lead materials having coefficients of thermal expansion of greater than $41 \times 10^{-7}/°C$. and the glass material having a coefficient of thermal expansion of $56 \times 10^{-7}/°C$. (Nos. 21, 22, 26, 27, 28, 29, 30, 31 and 32).

Thus, integrated circuit packages having high reliability without developing cracks in the sealing glass can be obtained if use is made of a substrate composed of a silicon carbide ceramic, a glass material having a coefficient of thermal expansion of 45 to $55 \times 10^{-7}/°C$., a cap material having a coefficient of thermal expansion of 35 to $50 \times 10^{-7}/°C$., and a lead frame material having a coefficient of thermal expansion of smaller than $40 \times 10^{-7}/°C$.

The cap is composed of a mullite ceramic having a coefficient of thermal expansion (40 to $55 \times 10^{-7}/°C$.) close to that of the silicon carbide ceramic, or a silicon carbide ceramic (25 to $35 \times 10^{-7}/°C$). The sealing glass has a coefficient of thermal expansion ranging from 40 to $55 \times 10^{-7}/°C$. close to the coefficients of thermal expansion of the silicon carbide ceramic that forms the substrate and of the cap material. From the standpoint of thermal resistance of the semiconductor element, sealing with the glass should be effected at a temperature of not higher than 500° C. Examples of the glass having a low sealing temperature and a small coefficient of thermal expansion include β-eucryptite, lead titanate and a glass of the lead borate type containing β-eucryptite and lead titanate, that can be used as sealing glasses in the present invention.

The lead pieces are composed of the Ni-Co-Fe alloy having a coefficient of thermal expansion of smaller than $40 \times 10^{-7}/°C$. at room temperature to 400° C., and having a martensite transformation temperature of lower than $-55°$ C. To prepare the lead pieces, iron, nickel and cobalt are blended together in required amounts and are melted under vacuum condition. The melt is then hot-rolled and is, thereafter, subjected to the cold rolling and the annealing repetitively to obtain a plate 0.18 mm in thickness. The plate is annealed again and is cold-rolled to have a thickness of 0.15 mm. Then, the plate is annealed at about 400° to 500° C. to remove strain. The lead frame is prepared from the thus obtained plate, in order to fabricate the integrated circuit package that is shown in FIG. 1. Reliability test over a temperature range of from $-55°$ to $+150°$ C. proves that no leakage takes place at all in the glass-sealed portions.

Figure 3:
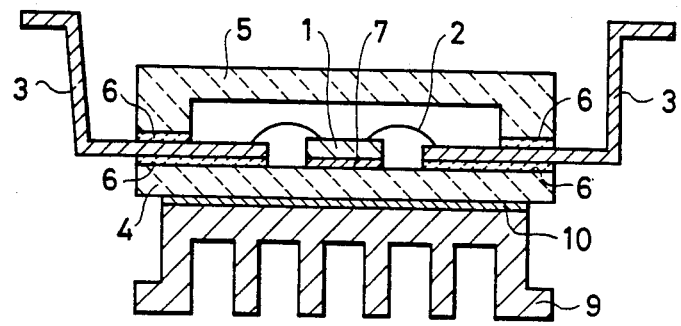
FIGS. 3 to 5 are section views of integrated circuit packages according to other embodiments of the present invention.

FIG. 3 illustrates an embodiment in which cooling fins 9 are adhered as designated at 10 onto the surface of the substrate 4 to effectively utilize a high thermal conductivity of the silicon carbide ceramic. In this case, the thermal resistance is 7.7° C./w between the semiconductor element and the surface of the substrate.

Figure 4:
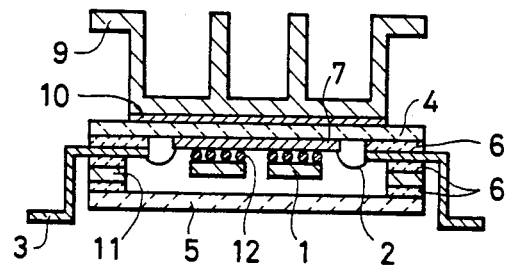

FIG. 4 illustrates an embodiment in which many semiconductor elements are mounted on a piece of silicon carbide ceramic substrate. In this package, a silicon wiring substrate 7 is joined onto the silicon carbide substrate 4, and semiconductor elements 1 are joined thereon via a binder 12. Even in this case, the lead material must have a small coefficient of thermal expansion. Here, reference numeral 11 denotes a flange.

Figure 5:
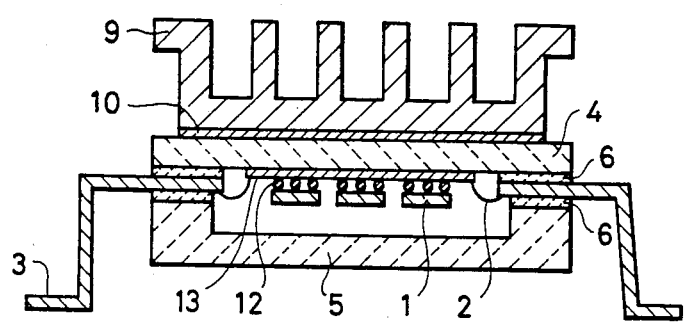

FIG. 5 shows a package in which a wiring board composed of a copper conductor and an insulating material is placed on the silicon carbide ceramic substrate, and semiconductor elements are joined thereon. Even in this package, the lead material must have a small coefficient of thermal expansion. Reference numeral 13 denotes a wiring.

According to the present invention as described above, no crack develops in the sealing glass even when the integrated circuit package employing the substrate composed of silicon carbide or aluminum nitride ceramic, is exposed to a test of predetermined thermal cycles.

According to the present invention, furthermore, there is obtained a highly reliable integrated circuit package that does not develop cracks in the glass-sealed portions even when it is cooled from the glass-sealing temperature down to room temperature or even when it is subjected to the life tost of thermal cycles ranging in temperature from $-55°$ to $+150°$ C.

What we claim is:

1. In an integrated circuit package in which at least one semiconductor element mounted on an insulating substrate, ends of lead pieces introduced from the outside and wires that electrically connect said at least one semiconductor element and said ends of said lead pieces are accommodated in a cell that is air-tightly defined by said substrate, a cap and a sealing glass, the improvement wherein said insulating substrate is composed of a ceramic material having a coefficient of thermal expansion of from 35 to $40 \times 10^{-7}/°C$. and a high thermal conductivity, said cap is composed of a ceramic material having a coefficient of thermal expansion of from 20 to $50 \times 10^{-7}/°C$., said sealing glass has a coefficient of thermal expansion of from 30 to $55 \times 10^{-7}/°C$., and said lead pieces are composed of an alloy having a coefficient of thermal expansion of smaller than $40 \times 10^{-7}/°C$.

2. An integrated circuit package according to claim 1, wherein said lead pieces are composed of an iron alloy which contains nickel and cobalt and has a martensite transformation temperature of lower than $-55°$ C.

3. An integrated circuit package according to claim 1, wherein said sealing glass is a low-melting glass that permits the sealing operation to be effected at a temperature of lower than 470° C.

4. An integrated circuit package according to claim 1, wherein said lead pieces are composed of an Ni-Co-Fe alloy.

5. An integrated circuit package according to claim 1, wherein said substrate is composed of a sintered product of silicon carbide.

6. An integrated circuit package according to claim 1, wherein said cap is composed of any one of mullite ceramic, silicon carbide ceramic, zircon ceramic, or silicon nitride ceramic.

7. An integrated circuit package according to claim 1, wherein said glass is composed of any one of β-eucryptite, lead titanate-type glass or lead borate-type glass.

8. An integrated circuit package according to claim 2, wherein said iron alloy has a composition consisting of 29 to 31% by weight of nickel, 12.5 to 15.5% by weight of cobalt, and the remainder being substantially iron.

9. An integrated circuit package according to claim 5, wherein said sintered product has a composition which contains at least either one of beryllium or a beryllium compound in an amount of 0.05 to 5% by weight on the basis of beryllium, and the remainder being substantially silicon carbide.

10. An integrated circuit package according to claim 8, wherein said iron alloy is annealed at a temperature ranging from 100° to 600° C. to remove the stress.

11. In an integrated circuit package in which at least one semiconductor element is mounted on an insulating substrate, ends of lead pieces introduced from the outside and wires that electrically connect said at least one semiconductor element and said ends of said lead pieces are accommodated in a cell that is air-tightly defined by said substrate, a cap and a sealing glass, the improvement wherein said insulating substrate is composed of a sintered product of aluminum nitride, said cap is composed of a ceramic material having a coefficient of thermal expansion of from 20 to $50 \times 10^{-7}/°C.$, said sealing glass has a coefficient of thermal expansion of from 30 to $55 \times 10^{-7}/°C.$, and said lead pieces are composed of an alloy having a coefficient of thermal expansion of smaller than $40 \times 10^{-7}/°C.$ 12. An integrated circuit package according to claim 11, wherein said lead pieces are composed of an iron alloy which contains nickel and cobalt and has a martensite transformation temperature of lower than $-55°$ C.

13. An integrated circuit package according to claim 11, wherein said sealing glass is a low-melting glass that permits the sealing operation to be effected at a temperature of lower than 470° C.

14. An integrated circuit package according to claim 11, wherein said lead pieces are composed of an Ni-Co-Fe alloy.

15. An integrated circuit package according to claim 11, wherein said cap is composed of any one of mullite ceramic, silicon carbide ceramic, zircon ceramic or silicon nitride ceramic.

16. An integrated circuit package according to claim 11, wherein said glass is composed of any one of $\beta$-eucryptite, lead titanate-type glass or lead borate-type glass.

17. An integrated circuit package according to claim 12, wherein said iron alloy has a composition consisting of 29 to 31% by weight of nickel, 12.5 to 15.5% by weight of cobalt, and the remainder being substantially iron.

18. An integrated circuit package according to claim 17, wherein said iron alloy is annealed at a temperature ranging from 100° C. to 600° C. to remove stress.

* * * * *